United States Patent
Shindo

(10) Patent No.: US 12,183,619 B2
(45) Date of Patent: Dec. 31, 2024

(54) METHOD OF DELIVERING SUBSTRATE, AND SUBSTRATE DELIVERY SYSTEM

(71) Applicant: Tokyo Electron Limited, Tokyo (JP)

(72) Inventor: Takehiro Shindo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 256 days.

(21) Appl. No.: 17/552,659

(22) Filed: Dec. 16, 2021

(65) Prior Publication Data

US 2022/0199456 A1 Jun. 23, 2022

(30) Foreign Application Priority Data

Dec. 23, 2020 (JP) .................................. 2020-213320

(51) Int. Cl.
*H01L 21/687* (2006.01)
*B23Q 7/00* (2006.01)

(52) U.S. Cl.
CPC ........ *H01L 21/68742* (2013.01); *B23Q 7/005* (2013.01)

(58) Field of Classification Search
CPC ......... H01L 21/68742; H01L 21/67742; H01L 21/67748; H01L 21/67754
USPC .......................................... 414/217; 118/719
See application file for complete search history.

(56) References Cited

U.S. PATENT DOCUMENTS

| 5,100,502 A * | 3/1992 | Murdoch .......... H01L 21/67748 414/744.1 |
| 2011/0076117 A1* | 3/2011 | Iizuka ............... H01L 21/67748 414/217 |
| 2015/0240357 A1* | 8/2015 | Tachibana ........... C23C 16/4586 118/725 |
| 2018/0108559 A1* | 4/2018 | Balan ................ H01L 21/68735 |
| 2020/0126828 A1* | 4/2020 | Oka .................... H01L 21/6831 |
| 2022/0365187 A1* | 11/2022 | Kodama ................ G01S 17/08 |

FOREIGN PATENT DOCUMENTS

| JP | 2002-64132 A | 2/2002 |
| JP | 2006-294786 A | 10/2006 |
| JP | 2009-165942 A | 7/2009 |

OTHER PUBLICATIONS

Batch Type Wafer Carrier; Document ID: KR 100376963 B1; Date Published: Mar. 26, 2003; Date Filed: Mar. 15, 2001 (Year: 2003).*

* cited by examiner

*Primary Examiner* — Mahdi H Nejad
(74) *Attorney, Agent, or Firm* — Nath, Goldberg & Meyer; Jerald L. Meyer; Tanya E. Harkins

(57) ABSTRACT

A method of delivering a substrate includes moving a holder configured to hold the substrate in a substrate transfer device above a region where an elevating member configured to be capable of being raised/lowered is arranged; and delivering the substrate from the holder to the elevating member by simultaneously performing lowering of the holder and raising of the elevating member, or delivering the substrate from the elevating member to the holder by simultaneously performing lowering of the elevating member that supports the substrate and raising of the holder.

3 Claims, 5 Drawing Sheets

METHOD OF DELIVERING SUBSTRATE, AND SUBSTRATE DELIVERY SYSTEM

CROSS-REFERENCE TO RELATED APPLICATION

This application is based upon and claims the benefit of priority from Japanese Patent Application No. 2020-213320, filed on Dec. 23, 2020, the entire contents of which are incorporated herein by reference.

TECHNICAL FIELD

The present disclosure relates to a method of delivering a substrate, and a substrate delivery system.

BACKGROUND

Patent Document 1 discloses a method of delivering a wafer between a tweezers, which is a wafer transfer mechanism, and a stage when the wafer is placed and processed on the stage. In this method, three lift pins protrude from the upper surface of the stage, and the tweezers reaches directly above the stage to prepare for delivering the wafer. Then, the tweezers is lowered, the wafer is placed on the lift pins, and then the tweezers is withdrawn from the stage. Subsequently, the lift pins are moved into the stage so that the wafer is placed on the stage.

PRIOR ART DOCUMENT

Patent Document

Patent Document 1: Japanese Laid-Open Patent Publication No. 2002-064132

SUMMARY

According to an aspect of the present disclosure, there is provided a method of delivering a substrate that includes moving a holder configured to hold the substrate in a substrate transfer device above a region where an elevating member configured to be capable of being raised/lowered is arranged; and delivering the substrate from the holder to the elevating member by simultaneously performing lowering of the holder and raising of the elevating member, or delivering the substrate from the elevating member to the holder by simultaneously performing lowering of the elevating member that supports the substrate and raising of the holder.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
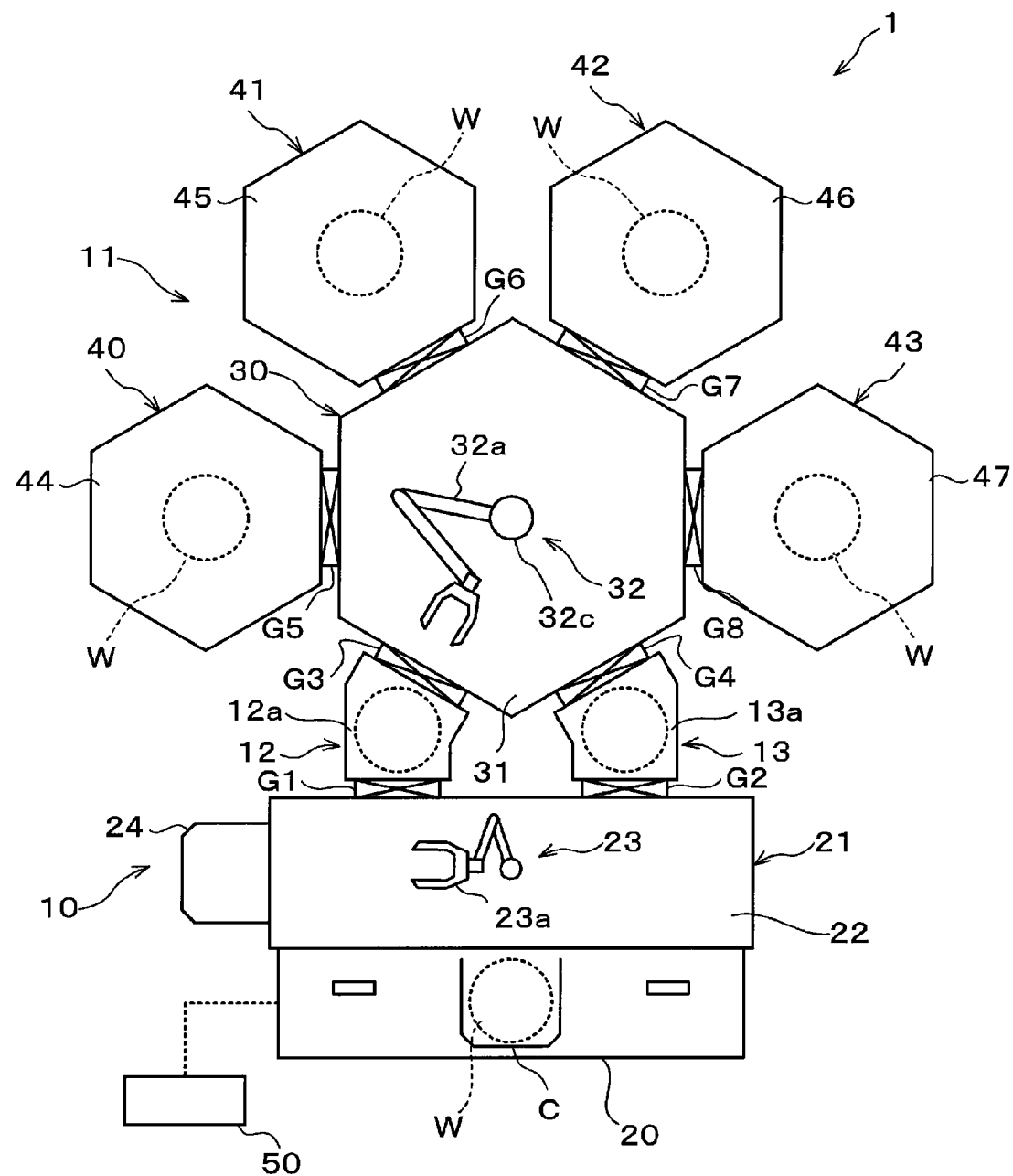
FIG. 1 is a schematic plan view showing a configuration of a wafer processing system as a substrate delivery system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For example, in the process of manufacturing a semiconductor device or the like, processes such as a film-forming process, an etching process and the like are performed on a substrate such as a semiconductor wafer (hereinafter referred to as a "wafer") under a reduced pressure atmosphere. The above-mentioned processes are performed by a processing apparatus provided with a stage on which the substrate is placed.

Loading/unloading of the substrate to/from the processing apparatus is performed by using a substrate transfer device provided with a pick which is a holder for holding the substrate. Further, placing the substrate from the pick of the substrate transfer device on the stage of the processing apparatus is performed by lift pins that are configured to be lifted up/down and support the substrate. Conventionally, for example, the substrate is placed through the lift pins as follows. That is, with the lift pins protruding from the upper surface of the stage, the pick of the substrate transfer device holding the substrate is moved above the lift pins, and then the pick is lowered to deliver the substrate to the lift pins. Then, the substrate is placed on the stage by retracting the pick and lowering the lift pins.

However, such a method has room for improvement in terms of the time required for delivery of the substrate.

Therefore, the technique according to the present disclosure performs high-speed delivery of the substrate between a pick of a substrate transfer device and an elevating member.

Hereinafter, a substrate delivery method and a substrate delivery system according to an embodiment will be described with reference to the drawings. Throughout the present specification and the drawings, elements having substantially the same functional configuration are denoted by the same reference numerals, and therefore, description thereof will not be repeated.

<Wafer Processing System>

Figure 2:
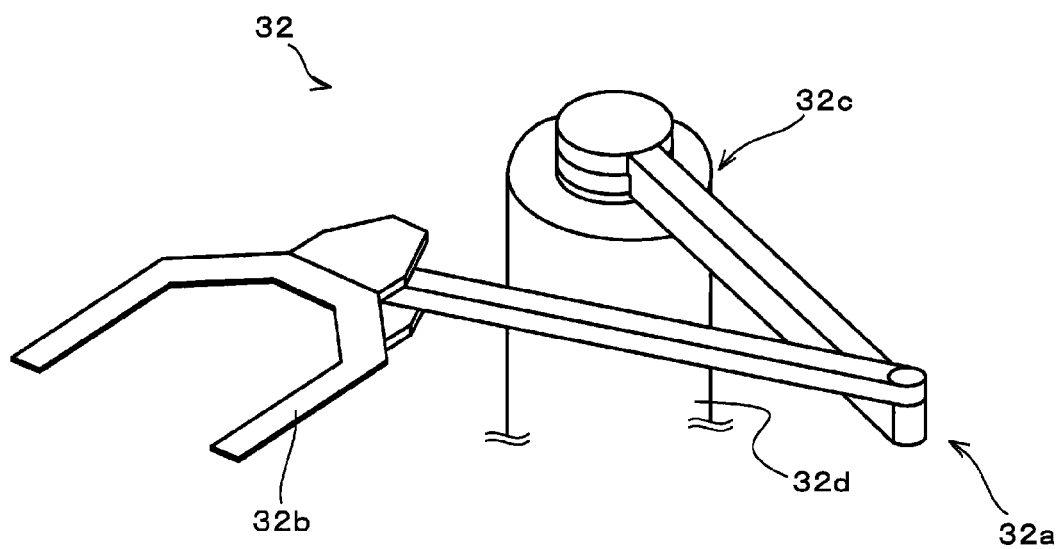
FIG. 2 is a schematic perspective view showing a configuration of a transfer arm.
Figure 3:
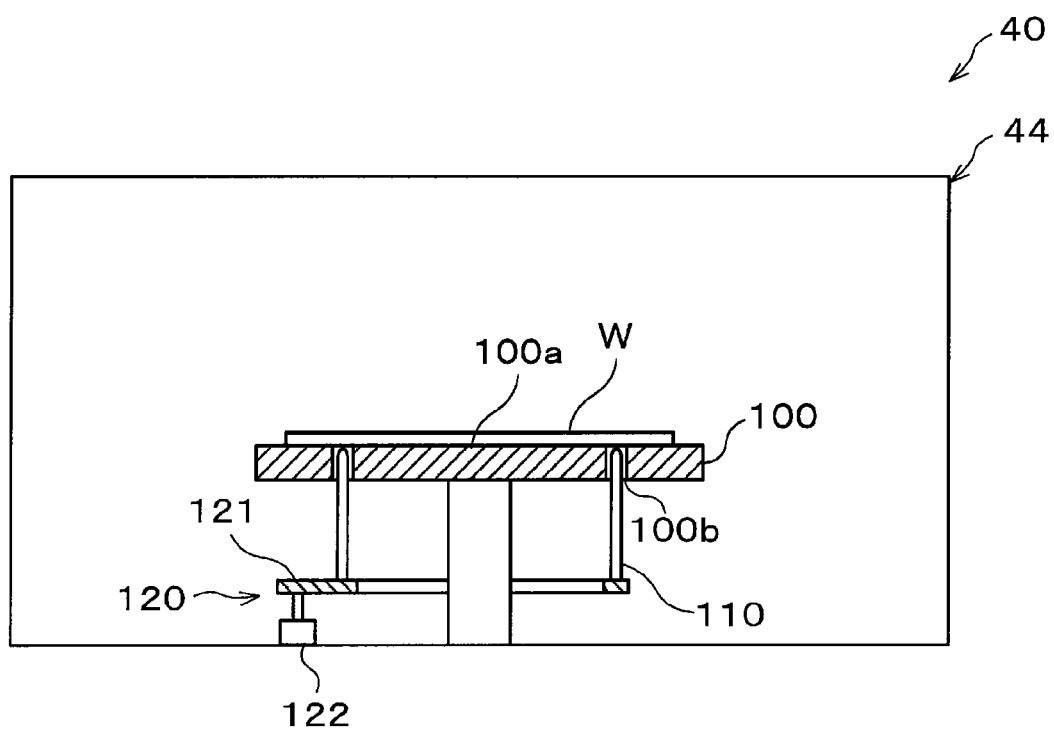
FIG. 3 is a view schematically showing only a portion of an internal configuration of a vacuum process chamber.

FIG. 1 is a schematic plan view showing a configuration of a wafer processing system as the substrate delivery system according to an embodiment. FIG. 2 is a schematic perspective view showing a configuration of a transfer arm. FIG. 3 is a view schematically showing only a portion of an internal configuration of a vacuum process chamber to be described later.

The wafer processing system 1 of FIG. 1 performs predetermined processes such as a film-forming process, a diffusion process, an etching process and the like on a wafer W as a substrate under a reduced pressure.

The wafer processing system 1 has a configuration in which a carrier station 10 into/from which a carrier C capable of accommodating a plurality of wafers is loaded/unloaded and a processing station 11 provided with a plurality of various processing apparatuses for performing the predetermined processes on the wafer W under the reduced pressure are connected integrally. The carrier station 10 and the processing station 11 are connected via two load lock devices 12 and 13.

The load lock devices 12 and 13 include load lock chambers 12a and 13a configured so as to switch the interior of the chambers between an atmosphere pressure state and a vacuum state, respectively. A support member (not shown) for supporting the wafer W is provided in each of the load lock chambers 12a and 13a.

Further, the load lock devices 12 and 13 are provided so as to connect an atmosphere pressure transfer device 21 and a vacuum transfer device 30, which will be described later.

The carrier station 10 includes a carrier stage 20 and an atmosphere pressure transfer device 21 provided adjacent to the carrier stage 20.

The carrier stage 20 is configured so as to place a plurality of carriers C, for example, three carriers C, side by side thereon.

The atmosphere pressure transfer device 21 includes an atmosphere transfer chamber 22 whose interior is under the atmosphere pressure. The atmosphere transfer chamber 22 is connected to the load lock chambers 12a and 13a of the load lock devices 12 and 13 via gate valves G1 and G2. A wafer transfer mechanism 23 is provided inside the atmosphere transfer chamber 22. The wafer transfer mechanism 23 is configured to transfer the wafer W between the carrier C on the carrier stage 20 and the load lock chambers 12a and 13a under the atmosphere pressure.

The carrier station 10 further includes an aligner 24 provided adjacent to the atmosphere pressure transfer device 21. The aligner 24 recognizes a notch or the like of the wafer W and adjusts orientation of the wafer W.

The processing station 11 includes the vacuum transfer device 30 as a substrate transfer device, and processing apparatuses 40 to 43.

The vacuum transfer device 30 includes a vacuum transfer chamber 31 whose interior is kept in a reduced pressure state (vacuum state). The vacuum transfer chamber 31 is composed of a housing configured to be capable of being sealed and is formed so as to have substantially a polygonal shape (hexagonal shape in the shown example) in a plan view, for example. The vacuum transfer chamber 31 is connected to the load lock chambers 12a and 13a of the load lock devices 12 and 13 via gate valves G3 and G4. Further, the vacuum transfer chamber 31 is connected to each of vacuum process chambers 44 to 47, which will be described later, via gate valves G5 to G8. A wafer transfer mechanism 32 as a substrate transfer mechanism for transferring the wafer W between the vacuum process chambers 44 to 47 (to be described later) of the processing apparatuses 40 to 43 is provided inside the vacuum transfer chamber 31.

The wafer transfer mechanism 32 includes one transfer arm 32a. The number of transfer arms 32a provided in the wafer transfer mechanism 32 may be two or more. The transfer arm 32a is composed of, for example, an articulated arm.

As shown in FIG. 2, the transfer arm 32a is provided with a pick 32b as a holder at a leading end thereof. The pick 32b is configured to be capable of moving up and down. Specifically, the pick 32b is configured to move up and down in accordance with the up/down movement of the entire transfer arm 32a. Further, the pick 32b is configured to be capable of moving forward and backward with respect to the processing apparatuses 40 to 43. Specifically, the pick 32b is configured to move forward and backward with respect to support pins 110 of each of the processing apparatuses 40 to 43 as the transfer arm 32a expands and contracts. The pick 32b is also configured to be capable of moving forward and backward with respect to each of the load lock chambers 12a and 13a. Specifically, the pick 32b is configured to move forward and backward with respect to a support member (not shown) of each of the load lock chambers 12a and 13a as the transfer arm 32a expands and contracts.

The wafer transfer mechanism 32 is configured to transfer the wafer W while holding the wafer W with the pick 32b of the transfer arm 32a.

Further, the wafer transfer mechanism 32 includes a base 32c. The base 32c pivotally supports the root of the transfer arm 32a. The base 32c is provided with a driver 32d for driving the forward/backward movement of the pick 32b with respect to the support pins 110 of each of the processing apparatuses 40 to 43 and the forward/backward movement of the pick 32b with respect to the support member (not shown) of each of the load lock chambers 12a and 13a. The driver 32d also drives the rotation of the transfer arm 32a around the base 32c. The driver 32d also drives the up/down movement of the transfer arm 32a, that is, the up/down movement of the pick 32b. The driver 32d includes an actuator (not shown) such as a motor that generates a driving force for the above-mentioned forward/backward movement, rotation, and up/down movement.

The processing apparatuses 40 to 43 perform predetermined processes such as a film-forming process, a diffusion process, an etching process and the like on the wafer W under a reduced pressure. Further, as shown in FIG. 1, the processing apparatuses 40 to 43 include the vacuum process chambers 44 to 47, respectively, in which the predetermined processes are performed on the wafer W under the reduced pressure.

As the processing apparatuses 40 to 43, an apparatus that performs a process according to the purpose of wafer processing can be arbitrarily selected.

As shown in FIG. 3, a stage 100 is provided inside the vacuum process chamber 44 of the processing apparatus 40.

A plurality of support pins 110 (for example, three support pins 110) as elevating members are provided below the stage 100 inside the vacuum process chamber 44 so as to extend in the vertical direction. These support pins 110 are connected to an elevating mechanism 120 that lifts up/down the support pins 110. The elevating mechanism 120 includes, for example, a support member 121 that supports the plurality of support pins 110, and a driver 122 that drives the lift-up/down of the support member 121, that is, the lift-up/down of the support pins 110. The driver 122 includes an actuator (not shown) such as a motor that generates a driving force for the lift-up/down. In order to deliver the wafer W between the stage 100 and the pick 32b, the support pins 110 moves upward and downward on an upper surface (that is, a placement surface) 100a of the stage 100 through respective through-holes 100b that penetrates the stage 100 in the thickness direction, that is, in the vertical direction.

Similar to the vacuum process chamber 44, the stage 100, the support pins 110, and the like are also provided inside the vacuum process chambers 45 to 47.

Further, as shown in FIG. 1, the wafer processing system 1 is provided with a controller 50. The controller 50 is, for example, a computer equipped with a CPU, a memory, or the like and includes a program storage part (not shown). The program storage part stores programs that implement various processes in the wafer processing system 1. For example, the program storage part stores a program that controls the driver 32d for the pick 32b and the driver 122 for the support pins 110 to implement wafer processing to be described below.

<Wafer Processing>

Next, an example of the wafer processing performed by using the wafer processing system 1 configured as described above will be described with reference to FIGS. 4 to 7. FIGS. 4 to 7 are views schematically showing an internal state of the vacuum process chamber 44 at the time of wafer processing, showing only a portion of the internal configuration of the vacuum process chamber 44. The following processing is performed under the control of the controller 50.

(S1: Loading of Wafer W into Vacuum Transfer Device 30)

First, the wafer W is loaded into the vacuum transfer device 30. Specifically, first, for example, the wafer W is taken out from the carrier C and loaded into the aligner 24 by the transfer arm 23a of the wafer transfer mechanism 23. Subsequently, orientation of the wafer W is adjusted in the aligner 24. Next, the wafer W is taken out from the aligner 24 by the transfer arm 23a, and the gate valve G1 is opened. After that, the wafer W is loaded into the load lock chamber 12a of the load lock device 12 by the transfer arm 23a and is delivered to the support member (not shown) in the load lock chamber 12a.

Subsequently, the transfer arm 23a is withdrawn from the load lock chamber 12a, and the gate valve G1 is closed to seal the interior of the load lock chamber 12a and reduce an internal pressure of the load lock chamber 12a.

When the internal pressure of the load lock chamber 12a becomes equal to or lower than a predetermined pressure, the gate valve G3 is opened, and the wafer W is picked up from the support member (not shown) in the load lock chamber 12a by the pick 32b of the transfer arm 32a and taken out of the load lock chamber 12a. After that, the gate valve G3 is closed.

(S2: Loading of Wafer W into Processing Apparatus 40)

Next, the wafer W is loaded into, for example, the processing apparatus 40.

(S2-1: Movement of Pick 32b)

Figure 4:
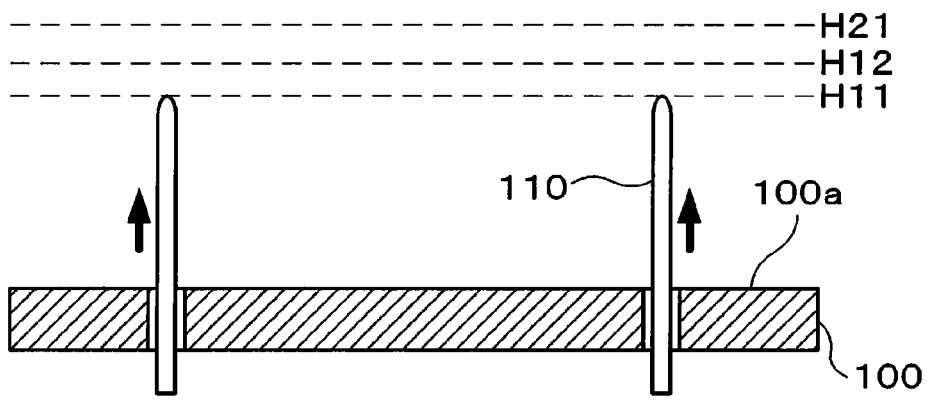
FIG. 4 is a view schematically showing an internal state of the vacuum process chamber at the time of wafer processing.
Figure 5:
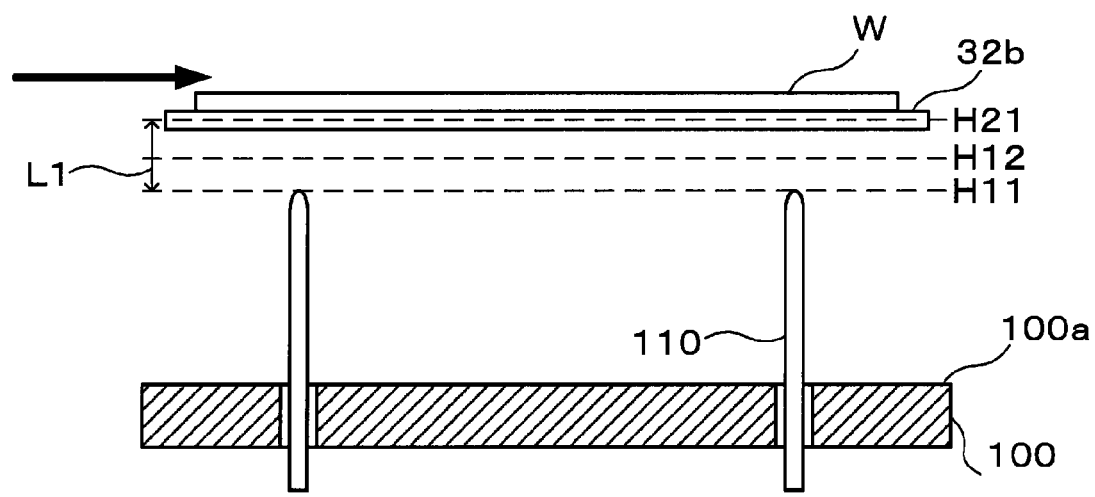
FIG. 5 is a view schematically showing an internal state of the vacuum process chamber at the time of wafer processing.

Specifically, first, the pick 32b holding the wafer W is moved above a region where the support pins 110 are arranged, that is, above the stage 100, in the processing apparatus 40. More specifically, first, as shown in FIG. 4, the support pins 110 are lifted up until the upper ends of the support pins 110 reach a first pin height H11. The first pin height H11 is a height of the support pins 110 when the wafer W is loaded/unloaded by the pick 32b. Specifically, the first pin height H11 is a height at which the support pins 110 protrude from the upper surface 100a of the stage 100, and is lower than a second pin height H12 and a first pick height H21, which will be described later. After the upper ends of the support pins 110 reach the first pin height H11, the gate valve G5 is opened. After that, the pick 32b holding the wafer W is inserted into the vacuum process chamber 44 by horizontal movement at the first pick height H21, as shown in FIG. 5, and is moved up to a position above the support pins 110 (specifically, up to a position at which the wafer W held by the pick 32b and all the support pins 110 overlap each other in a plan view). The first pick height H21 is a height of the pick 32b when the wafer W is loaded/unloaded by the pick 32b. Specifically, the first pick height H21 is higher than the first pin height H11 and the second pin height H12, which will be described later. Further, a distance L1 between the first pick height H21 and the first pin height H11 is set so that the pick 32b and the wafer W and the support pins 110 do not come into contact with each other when the pick 32b holding the wafer W is horizontally moved.

(S2-2: Delivery of Wafer W from Pick 32b to Support Pins 110)

Figure 6:
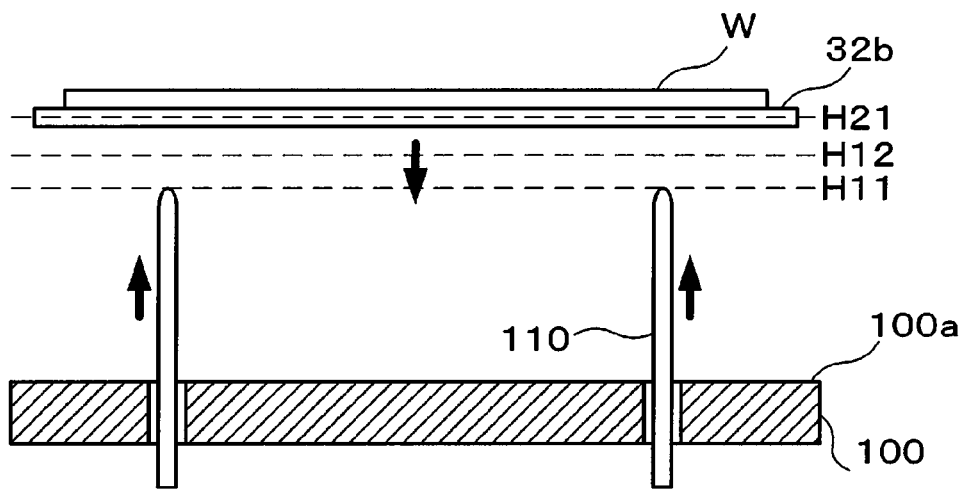
FIG. 6 is a view schematically showing an internal state of the vacuum process chamber at the time of wafer processing.
Figure 7:
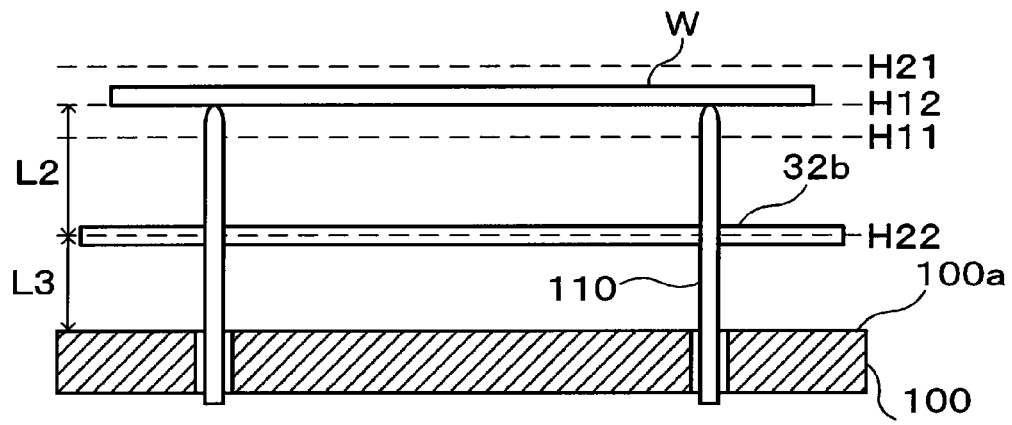
FIG. 7 is a view schematically showing an internal state of the vacuum process chamber at the time of wafer processing.

After the pick 32b holding the wafer W is horizontally moved, lowering of the pick 32b and lifting-up of the support pins 110 are performed at the same time, as shown in FIG. 6, so that the wafer W is delivered from the pick 32b to the support pins 110, as shown in FIG. 7. Specifically, the lowering of the pick 32b from the first pick height H21 to the second pick height H22 and the lifting-up of the support pins 110 whose upper ends are set from the first pin height H11 to the second pin height H12 are performed at the same time. As a result, the wafer W is delivered from the pick 32b to the support pins 110 at a height between the first pick height H21 and the second pick height H22 and between the first pin height H11 and the second pin height H12, and the upper end of the wafer W is supported by the support pins 110 located at the second pin height H12. For example, the second pick height H22 is lower than the first pin height H11, and the second pin height H12 is also lower than the first pick height H21.

A distance L2 between the second pin height H12 and the second pick height H22 and a distance L3 between the second pick height H22 and the upper surface 100a of the stage 100 are set as follows. That is, the distance L3 is set so that the wafer W supported by the support pins 110 and the upper surface 100a of the stage 100 do not come into contact with the pick 32b when the pick 32b is horizontally moved at the second pick height H22 for extraction or insertion of the pick 32b.

(S2-3: Placement of Wafer W on Stage 100)

After the wafer W is delivered from the pick 32b to the support pins 110, the wafer W is placed on the stage 100 by the support pins 110. Specifically, the pick 32b is withdrawn from the stage 100 by the horizontal movement at the second pick height H22, that is, withdrawn from the support pins 110, and is also withdrawn from the vacuum process chamber 44. The support pins 110 are then lifted down so that the upper ends thereof are moved into the stage 100. As a result, the wafer W is delivered from the support pins 110 to the upper surface 100a of the stage 100 and is placed on the stage 100. After that, the gate valve G5 is closed to seal the vacuum process chamber 44.

(S3: Process)

Subsequently, a process such as an etching process or the like is performed on the wafer W in the processing apparatus 40.

(S4: Unloading of Wafer W from Processing Apparatus 40)

After that, the wafer W is unloaded from the processing apparatus 40.

(S4-1: Removal of Wafer W from Stage 100)

Specifically, first, in the processing apparatus 40, the wafer W is removed from the stage 100 by the support pins 110. More specifically, the support pins 110 are lifted up until the upper ends of the support pins 110 reach the second pin height H12. As a result, the wafer W is removed from the upper surface 100a of the stage 100 and is delivered to the support pins 110, and the upper end of the wafer W is supported by the support pins 110 located at the second pin height H12.

(S4-2: Movement (Entry) of Pick 32b)

After the support pins 110 are lifted up, the pick 32b is moved above and enters a region where the support pins 110 are arranged, that is, above the stage 100. More specifically, first, the gate valve G5 is opened, and then the pick 32b is inserted into the vacuum process chamber 44 by the horizontal movement at the second pick height H22 and enters between the wafer W supported by the support pins 110 and the upper surface 100a of the stage 100.

(S4-3: Delivery of Wafer W from Support Pins 110 to Pick 32b)

After the pick 32b is horizontally moved, raising of the pick 32b and lifting-down of the support pins 110 are performed at the same time so that the wafer W is delivered from the support pins 110 to the pick 32b. Specifically, the raising of the pick 32b from the second pick height H22 to the first pick height H21 and the lifting-down of the support pins 110 whose upper ends are set from the second pin height H12 to the first pin height H11 are performed at the same time. As a result, the wafer W is delivered from the support pins 110 to the pick 32b and is held by the pick 32b located at the first pick height H21.

(S4-4: Withdrawn of Pick 32b and Lifting-down of Support Pins 110)

After the wafer W is held by the pick 32b, the pick 32b is withdrawn from the vacuum process chamber 44 and the support pins 110 are lifted down. More specifically, first, the pick 32b is withdrawn from above the stage 100 and the support pins 110 by the horizontal movement at the first pick height H21 and is also withdrawn from the interior of the vacuum process chamber 44. The support pins 110 are then lifted down so that the upper ends thereof are moved into the stage 100. After that, the gate valve G5 is closed.

(S5: Unloading of Wafer W from Vacuum Transfer Device 30)

Subsequently, the wafer W is unloaded from the vacuum transfer device 30 and returned to the carrier C in the reverse procedure of the above step S1. However, in the course of returning to the carrier C, loading/unloading of the wafer W into/from the aligner 24 and adjustment of the orientation of the wafer W at the aligner 24 are omitted.

A series of wafer processing is terminated in this manner

As described above, the method of delivering the wafer W according to the present embodiment includes a step of moving the pick 32b above the region where the support pins 110 are arranged. Further, this delivery method includes a step of delivering the wafer W from the pick 32b to the support pins 110 by performing the lowering of the pick 32b holding the wafer W and the lifting-up of the support pins 110 at the same time, and a step of delivering the wafer W from the support pins 110 to the pick 32b by performing the lifting-down of the support pins 110 supporting the wafer W and the raising of the pick 32b at the same time. That is, in this delivery method, when the wafer W is delivered between the pick 32b and the support pins 110, the lowering (or lifting-down) of one, which holds the wafer W, of the pick 32b and the support pins 110, and the raising (or lifting-up) of the other, which does not hold the wafer W, of the pick 32b and the support pins 110, are performed at the same time. For example, the lowering of the pick 32b holding the wafer W from the first pick height H21 to the second pick height H22 and the lifting-up of the support pins 110 whose upper ends thereof are set from the first pin height H11 to the second pin height H12 are performed at the same time. Further, in this delivery method, the distance L1 between the first pick height H21 and the first pin height H11 is set so that the pick 32b and the wafer W and the support pins 110 do not come into contact with each other when the pick 32b holding the wafer W is horizontally moved, as described above. In other words, in this delivery method, the first pick height H21 is set in a range in which contact between the pick and the support pins does not occur at the time of loading/unloading of the wafer, based on the first pin height H11.

Figure 8:
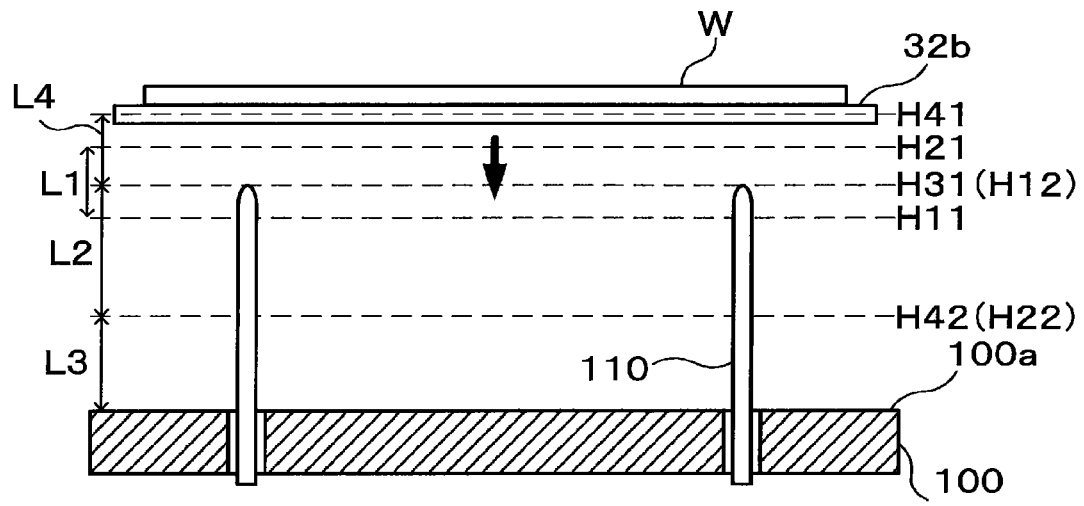
FIG. 8 is a view for explaining a conventional wafer delivery method.

In contrast, in the conventional method of delivering the wafer W, when the wafer W is delivered between the pick 32b and the support pins 110, only one of the pick 32b and the support pins 110 is raised/lowered (or lifted up/down), and the other is fixed. For example, in the conventional method of delivering the wafer W, as shown in FIG. 8, in a state where the support pins 110 are fixed at a delivery height H31 at which the upper ends of the support pins 110 protrude from the upper surface 100a of the stage 100, the pick 32b holding the wafer W is lowered from a first pick height H41 to a second pick height H42, whereby the wafer W is delivered from the pick 32b. Further, in the conventional method, a distance L4 between the first pick height H41 and the delivery height H31 of the support pins 110 is set so that the pick 32b and the wafer W and the support pins 110 do not come into contact with each other when the pick 32b holding the wafer W is horizontally moved, like the distance L1 in the present delivery method. In other words, in the conventional method, the first pick height H41 is set within a range in which contact between the pick and the support pins does not occur at the time of loading/unloading of the wafer, based on the delivery height H31.

Here, a case is considered in which the delivery height H31 in the conventional method and the second pin height H12 in the present delivery method are the same. In this case, the first pin height H11 lower than the second pin height H12 in the present delivery method is lower than the delivery height H31 in the conventional method. Then, as described above, the first pick height H21 and the first pick height H41 are set within a range in which contact between the pick and the support pins does not occur at the time of loading/unloading of the wafer, based on the first pin height H11 in the present delivery method and based on the delivery height H31 in the conventional method, respectively. Therefore, in the present delivery method, the first pick height H21 can be made lower than the first pick height H41 in the conventional method in the range in which contact between the pick and the support pins does not occur at the time of loading/unloading of the wafer (for example, so that the distance L1 in the present delivery method is equal to the distance L4 in the conventional method).

Further, as described above, when the delivery height H31 in the conventional method and the second pin height H12 in the present delivery method are the same, the present delivery method also has the following effects since the first pick height H21 can be made lower than the first pick height H41 in the conventional method. That is, when the second pick height H42 in the conventional method is equal to the second pick height H22 in the present delivery method, a vertical movement distance, that is, an elevating distance, of the pick 32b can be set to be shorter than that in the conventional method when the wafer W is delivered between the pick 32b and the support pins 110.

Therefore, according to the present delivery method, the wafer W can be delivered between the pick 32b and the support pins 110 in a short period of time, that is, at a high speed.

The time required for delivering the wafer W between the pick 32b and the support pins 110 can be shortened by, for example, raising/lowering the pick 32b, that is, up/down movement the transfer arm 32a, at a high speed. However, when the transfer arm 32a is moved up and down at a high speed, a vibration of the transfer arm 32a becomes large. Due to this vibration, the wafer W shifts on the pick 32b, or the wafer cannot be properly delivered between the pick 32b and the support pins 110.

In contrast, according to the present delivery method, since the elevating distance of the pick 32b when the wafer W is delivered between the pick 32b and the support pins 110 can be set to be shorter, the wafer W can be delivered in a short period of time even if the pick 32b is not raised and lowered at a high speed. That is, according to the present delivery method, the wafer W can be delivered between the pick 32b and the support pins 110 in a short period of time without increasing the vibration of the transfer arm 32a.

Further, according to the present delivery method, since the elevating distance of the pick 32b can be set to be shorter as described above, the power consumption at the time of raising/lowering of the pick 32b can be suppressed, and openings (specifically, opening heights) of the processing apparatuses 40 to 43 in which the gate valves G5 to G8 are provided can be reduced. The smaller the openings, the better the processing results can be obtained in the processing apparatuses 40 to 43. Further, since the openings can be made smaller, the gate valves G5 to G8 can also be made smaller. By making the gate valves G5 to G8 smaller, it is possible to reduce the amount of air consumed for opening/closing the gate valves G5 to G8 and the amount of movement of the gate valves G5 to G8 at the time of opening/closing of the gate valves G5 to G8. Further, by reducing the amount of movement of the gate valves G5 to G8 as described above, it is possible to further shorten the time required for delivering the wafer W between the pick 32b and the support pins 110, including the opening/closing of the gate valves G5 to G8.

Further, since the gate valves G5 to G8 and the openings provided with the gate valves G5 to G8 can be reduced, it is possible to miniaturize the wafer processing system 1 as a whole.

<Other Examples of Wafer Processing Systems to which the Present Delivery Method is Applied>

Figure 9:
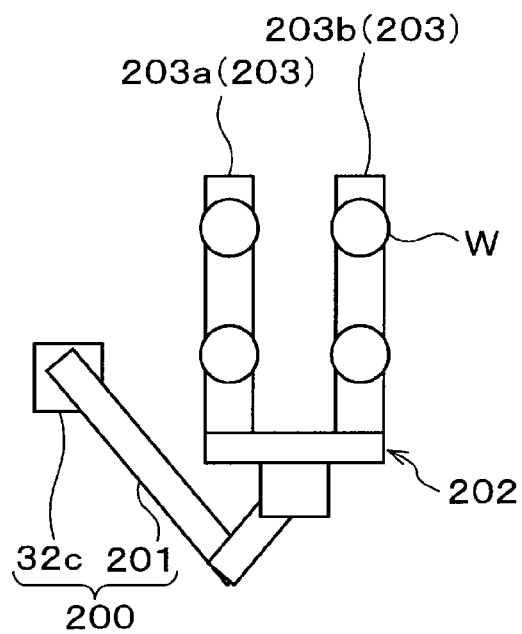
FIG. 9 is a view for explaining another example of the wafer processing system to which a delivery method according to an embodiment is applied.

FIG. 9 is a view for explaining another example of the wafer processing system to which the present delivery method is applied, and is a schematic plan view showing a configuration of a wafer transfer mechanism provided in a vacuum transfer device included in the wafer processing system.

A wafer transfer mechanism 200 of FIG. 9 is different from the wafer transfer mechanism 32 of FIG. 3 in terms of configuration of a transfer arm, specifically, a holder for holding the wafer W which is provided at the leading end of the transfer arm. The holder, that is, the pick 32b, of the transfer arm 32a of the wafer transfer mechanism 32 in FIG. 3 can hold only one wafer W, whereas the holder 202 of the transfer arm 201 of the wafer transfer mechanism 200 is configured to be capable of holding a plurality of wafers W (for example, 4 wafers W) at once.

Specifically, the holder 202 of the transfer arm 201 includes a pair of long plate portions 203. Hereinafter, one of the long plate portions 203 is referred to as a first long plate portion 203a, and the other is referred to as a second long plate portion 203b. The first long plate portion 203a and the second long plate portion 203b are each formed in an elongated plate shape so as to extend in the horizontal direction. Further, the first long plate portion 203a and the second long plate portion 203b are provided so as to be parallel to each other. The length of the first long plate portion 203a is a length capable of collectively holding the plurality of wafers W (two wafers W in this example) arranged along the longitudinal direction of the first long plate portion 203a. Further, the width (length in the horizontal plane in the direction perpendicular to the longitudinal direction) of the first long plate portion 203a is formed to be smaller than the diameter of the wafer W, for example. The length and width of the second long plate portion 203b are the same as those of the first long plate portion 203a.

The wafer transfer mechanism 200 configured as described above loads the plurality of wafers W into the processing apparatus at the same time. This processing apparatus is provided with a number of stages similar to the stage 100 of FIG. 3 corresponding to the number of wafers W held by the wafer transfer mechanism 200, and each stage is provided with support pins similar to the support pins 110 of FIG. 3. Then, this processing apparatus performs a process such as an etching process on the plurality of wafers W at the same time.

In the wafer processing system having the above-mentioned processing apparatus and the vacuum transfer device provided with the wafer transfer mechanism 200, the plurality of wafers W are delivered at the same time from the holder 202 of the wafer transfer mechanism 200 to support pins provided in the processing apparatus or from the support pins to the holder 202. The present delivery method can also be applied to the simultaneous delivery of the plurality of wafers W.

Further, when the holder 202 is configured to be capable of holding the wafers W collectively as in the wafer transfer mechanism 200, since the transfer arm 201 becomes large, the rigidity of the transfer arm 201 (specifically, the rigidity of the first and second long plate portions 203a and 203b) is lowered, whereby a vibration is likely to occur in the transfer arm 210 when the transfer arm 210 is raised and lowered at a high speed. Even in the wafer processing system provided with the wafer transfer mechanism 200 having such a transfer arm 201 that is likely to vibrate, the present delivery method can be applied to deliver the plurality of wafers W at the same time between the holder 202 and the support pins in the processing apparatus in a short period of time without increasing the vibration of the transfer arm 201.

<Modifications>

In the above, the present delivery method has been described with an example in which the wafer is delivered between the liftable support pins provided in the processing apparatus and the holder of the transfer arm. However, when a support member in a load lock chamber is configured to be capable of lifting up and down, the present delivery method can also be applied to a case in which the wafer is delivered between the support member in the load lock chamber and the holder of the transfer arm.

In the above, the load lock chamber is not configured in multiple stages in the vertical direction, but may be configured in multiple stages. When the load lock chamber is configured in multiple stages, an elevating mechanism for the transfer arm is indispensable for the wafer transfer mechanism provided in the vacuum transfer device. According to the present delivery method, when the load lock chamber is configured in multiple stages in the vertical direction, the elevating mechanism of the transfer arm, which is indispensable in this case, can be effectively utilized.

According to the present disclosure in some embodiments, it is possible to shorten the time required for delivering a substrate between a holder for holding a substrate of a substrate transfer device and an elevating member configured to be capable of being elevated.

The embodiments disclosed this time should be considered to be exemplary in all respects, not restrictive. The above embodiments may be partially omitted, replaced or changed in various forms without departing from the accompanying claims and the gist thereof.

What is claimed is:

1. A method of delivering a substrate, the method comprising:
   moving a pick configured to hold the substrate in a substrate transfer device above a region where a support pin configured to be capable of being raised/lowered is arranged;
   delivering the substrate from the pick to the support pin by simultaneously performing lowering of the pick and raising of the support pin; and
   delivering the substrate from the support pin to the pick by simultaneously performing lowering of the support pin that supports the substrate and raising of the pick.

2. The method of claim 1, wherein the pick is configured to be capable of holding a plurality of substrates, and
   wherein the delivering the substrate includes simultaneously delivering the plurality of substrates from the pick to the support pin or from the support pin to the pick.

3. A substrate delivery system comprising:
   a support pin configured to be capable of being raised/lowered;
   a first driver configured to drive raising/lowering of the support pin;
   a substrate transfer device including a pick configured to hold a substrate and to be capable of being raised/lowered and moving forward and backward with respect to the support pin;
   a second driver configured to drive the raising/lowering and the forward/backward movement of the pick with respect to the support pin; and
   a controller configured to control the first driver and the second driver so as to perform a process of:
   moving the pick above a region where the support pin is arranged; delivering the substrate from the pick to the support pin by simultaneously performing the lowering of the pick and the raising of the support pin; and
   delivering the substrate from the support pin to the pick by simultaneously performing the lowering of the support pin that supports the substrate and the raising of the pick.

* * * * *